United States Patent
Jeon et al.

(10) Patent No.: US 12,233,501 B2
(45) Date of Patent: Feb. 25, 2025

(54) SUBSTRATE SUPPORT DEVICE

(71) Applicant: TES Co., Ltd, Yongin-si (KR)

(72) Inventors: Sang-Jean Jeon, Yongin-si (KR); Hyun-Sang Hwang, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 169 days.

(21) Appl. No.: 18/111,228

(22) Filed: Feb. 17, 2023

(65) Prior Publication Data

US 2023/0256551 A1  Aug. 17, 2023

(30) Foreign Application Priority Data

Feb. 17, 2022  (KR) .................. 10-2022-0020793
Jan. 13, 2023  (KR) .................. 10-2023-0005429

(51) Int. Cl.
*H01J 37/00* (2006.01)
*B23Q 3/154* (2006.01)
*H01J 37/32* (2006.01)

(52) U.S. Cl.
CPC ........ *B23Q 3/154* (2013.01); *H01J 37/32532* (2013.01); *H01J 37/32541* (2013.01); *H01J 37/32568* (2013.01); *H01J 37/32697* (2013.01); *H01J 37/32715* (2013.01); *H01J 2237/332* (2013.01)

(58) Field of Classification Search
CPC ........... H01J 37/32541; H01J 37/32568; H01J 37/32697; H01J 37/32715; H01J 37/332; H01J 2237/332; H01J 37/32091; H01J 37/32174; H01J 37/32532; H01J 37/32577; H01J 37/32706; H01J 37/32724

See application file for complete search history.

(56) References Cited

U.S. PATENT DOCUMENTS

| | | | |
|---|---|---|---|
| 2017/0111025 A1* | 4/2017 | Kapoor | H01J 37/32724 |
| 2023/0294208 A1* | 9/2023 | Parkhe | B23K 26/3584 |
| | | | 219/121.69 |
| 2024/0234108 A1* | 7/2024 | Bhat | G03F 7/70708 |
| 2024/0249924 A1* | 7/2024 | Li | H01J 37/32724 |

FOREIGN PATENT DOCUMENTS

| | | |
|---|---|---|
| JP | 2012-089694 A | 5/2012 |
| KR | 10-2010-0126510 A | 12/2010 |
| KR | 10-2020-0014881 A | 2/2020 |
| KR | 10-2021-0028137 A | 3/2021 |

OTHER PUBLICATIONS

Korean Office Action for related KR Application No. 10-2023-0005429 mailed Aug. 5, 2024 from Korean Intellectual Property Office.

* cited by examiner

*Primary Examiner* — Tuan T Lam
(74) *Attorney, Agent, or Firm* — Paratus Law Group, PLLC

(57) ABSTRACT

There is provided a substrate support device. The substrate support device includes a substrate support part on which a wafer is deposited, the substrate support part including a first mesh electrode and a second mesh electrode disposed under the first mesh electrode; a chucking circuit configured to apply a DC voltage to the first mesh electrode; and an edge control circuit configured to control timings of operations related to the first mesh electrode and the second mesh electrode and control RF (Radio Frequency). The second mesh electrode is divided into a plurality of second sub-mesh electrode to remove an induced electromotive force generated due to a closed loop.

16 Claims, 4 Drawing Sheets

(a)  (b)  (c)

SUBSTRATE SUPPORT DEVICE

CROSS-REFERENCE TO RELATED APPLICATIONS

This application claims priority to Korean Patent Application Nos. 10-2022-0020793 (filed on Feb. 17, 2022) and 10-2023-0005429 (filed on Jan. 13, 2023), which are all hereby incorporated by reference in their entireties.

BACKGROUND

The present disclosure relates to a substrate support device.

A substrate support device is used to process wafers by techniques including etching, PVD (Physical Vapor Deposition), CVD (Chemical Vapor Deposition), PECVD (Plasma-Enhanced Chemical Vapor Deposition), ALD (Atomic Layer Deposition), PEALD (Plasmaenhanced Atomic Layer Deposition), PDL (Pulsed Deposition Layer), Plasma-Enhanced Pulsed Deposition Layer (PEPDL), and resist removal.

Such a substrate support device is a plasma processing device including a reaction chamber, and radio frequency (RF) power is applied between electrodes to excite a process gas into plasma for depositing a wafer in the reaction chamber.

A prior art of Cited document 1 (KR No. 10-2020-0014881 A) relates to an electrostatic chuck for use in semiconductor processing and discloses a plasma-enhanced vapor deposition processing device to deposit thin films.

In addition, another prior art of Cited document 2 (JP 2012-089694) relates to electrostatic chuck for use in semiconductor processing and discloses a plasma-enhanced chemical vapor deposition processing device to deposit thin films.

FIG. 1 is a view showing a mesh structure of a prior substrate support device.

Referring to FIG. 1, one mesh electrode 110 is provided as shown in FIG. 1 (*a*) or, a first mesh electrode 110 is provided and a second mesh electrode 120 may be disposed under the first mesh electrode 110 as shown in FIG. 1 (*b*) in this instance, the second mesh electrode 120 is not ring-shaped but disc-shaped.

As shown in FIG. 1 (*c*), a first mesh electrode may be divided into two sub-electrodes 111, 112 and a second mesh electrode 130 may be disposed under the two sub-electrodes 111 and 1112. The second mesh electrode 130 have two semicircular shapes formed therein and the two semicircular shapes are separated by a cross mesh 131. One sub-electrode is disposed inside each of the two semicircular shapes.

However, in the conventional mesh structure, a path of a current is random and there is an impedance difference between edges 141 and 142 of the second mesh electrode. There could be a problem of randomness occurring in a current path.

Accordingly, a need arises for a new mesh structure for high uniformity control.

PRIOR ART

Patent Cited Documents (Cited document 1) KR 10-2020-0014881 A
(Cited document 2) JP 2012-089694

SUMMARY

Accordingly, one object of the present disclosure is to provide a substrate support device including a new mesh structure.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

To solve the above-noted objects of the present disclosure, a substrate support device may include a substrate support part on which a wafer is deposited, the substrate support part comprising a first mesh electrode and a second mesh electrode disposed under the first mesh electrode; a chucking circuit configured to apply a DC voltage to the first mesh electrode; and an edge control circuit configured to control timings of operations related to the first mesh electrode and the second mesh electrode and control RF (Radio Frequency). The second mesh electrode is divided into a plurality of second sub-mesh electrode to remove an induced electromotive force generated due to a closed loop.

According to an embodiment, the substrate support part may include a heating unit disposed under the second mesh electrode to supply heat. The heating unit may include a heating element corresponding to the number of the first mesh electrode.

According to an embodiment, the second mesh electrode has a ring shape.

The substrate support device may further include a spoke disposed under the first mesh electrode. The spoke may be disposed on the same plane with the second mesh electrode.

The first mesh electrode may be one or divided into two first sub-mesh electrodes.

According to an embodiment, when the first mesh electrode is divided into the two first sub-mesh electrodes, the two first sub-mesh electrodes may overlap on an inner circumferential surface of the second mesh electrode, spaced a predetermined apart from each other.

According an embodiment, when the first mesh electrode is divided into the two first sub-mesh electrodes and the second mesh electrode is divided into four second sub-mesh electrodes, the substrate support device may include a first spoke disposed under the two first sub-mesh electrodes in a direction equal to a spaced apart direction of the two first sub-mesh electrodes; and a second spoke disposed perpendicular to the first spoke.

The two first sub-mesh electrodes may overlap on inner circumferential surfaces of the four second sub-mesh electrodes, spaced a predetermined distance apart from each other in a direction in which the spaced apart direction of the two first sub-mesh electrodes is not equal to a spaced apart direction of the four second sub-mesh electrodes.

According to an embodiment, when the first mesh electrode is divided into the two first sub-mesh electrodes and the second mesh electrode is divided into two second sub-mesh electrodes, the substrate support device may include a spoke disposed under the two first sub-mesh electrodes in a direction perpendicular to the spaced apart direction of the two second sub-mesh electrodes.

The two first sub-mesh electrodes may overlap on inner circumferential surfaces of the two second sub-mesh electrodes in a direction in which the spaced apart direction of the two first sub-mesh electrodes bisects an angle formed by the spaced apart direction of the two second sub-mesh electrodes and the direction of the spoke, spaced a predetermined distance apart from each other.

According to an embodiment, when the first mesh electrode is divided into the two first sub-mesh electrodes and the second mesh electrode is divided into three second sub-mesh electrodes, the substrate support device may include a spoke disposed under the two first sub-mesh electrodes in a shape opposite to a spaced apart shape of the three second sub-mesh electrodes.

According to an embodiment, when the first mesh electrode is one and the second mesh electrode is divided into four second sub-mesh electrode, the substrate support device may include a first spoke disposed in a direction that bisects an angle formed by a spaced apart direction of the four second sub-mesh electrodes; and a second spoke disposed in a direction perpendicular to the first spoke.

In another aspect of the present disclosure, a substrate support device configured to implement a deposition process for a surface of a wafer, the substrate support device may include a first mesh electrode disposed under the wafer, the first mesh electrode that is one or divided into one or two; and a second mesh electrode disposed under the first mesh electrode. The second mesh electrode may be divided into two, three or four electrodes to remove an induced electromotive force generated due to a closed-loop with the first mesh electrode.

According to the present disclosure, the induced electromotive force generated due to the closed-loop may be removed by dividing the mesh electrode disposed in the lower portion into the plurality of sub-mesh electrodes.

In addition, the present disclosure may remove randomness of current paths of the mesh electrodes.

Specific effects are described along with the above-described effects in the section of Detailed Description.

DETAILED DESCRIPTION

Figure 1:
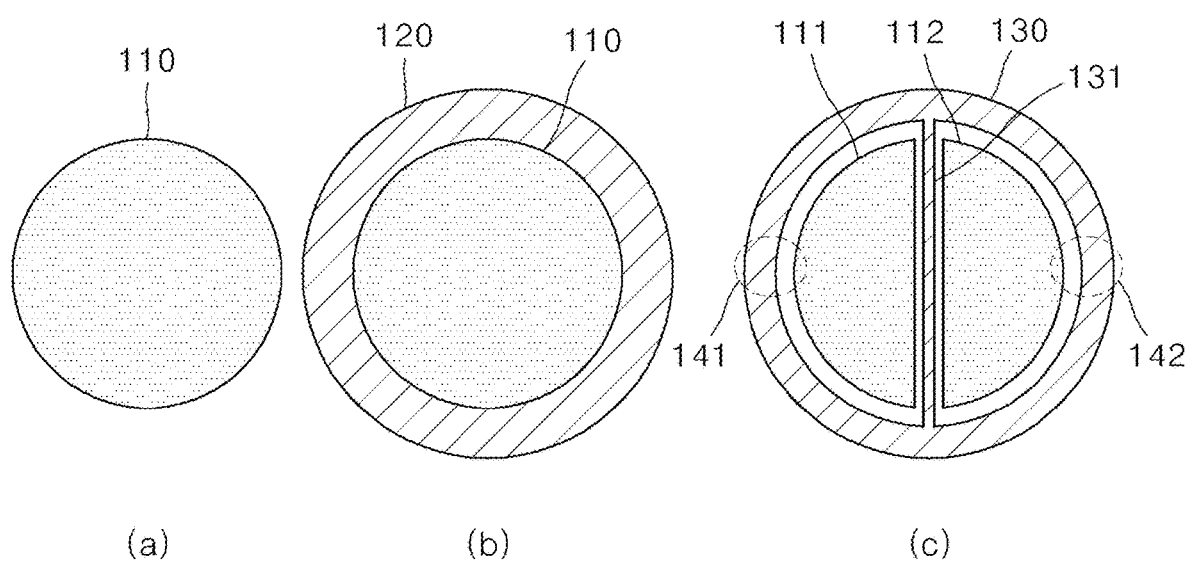
FIG. 1 is a view showing a mesh structure of a conventional substrate device.

The above-described aspects, features and advantages are specifically described hereunder with reference to the accompanying drawings such that one having ordinary skill in the art to which the present disclosure pertains can easily implement the technical spirit of the disclosure. In the disclosure, detailed descriptions of known technologies in relation to the disclosure are omitted if they are deemed to make the gist of the disclosure unnecessarily vague. Below, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component unless stated to the contrary.

Hereinafter, expressions of 'a component is provided or disposed in an upper or lower portion' may mean that the component is provided or disposed in contact with an upper surface or a lower surface. The present disclosure is not intended to limit that other elements are provided between the components and on the component or beneath the component.

It will be understood that when an element is referred to as being "connected with" another element, the element can be directly connected with the other element or intervening elements may also be present. In contrast, when an element is referred to as being "directly connected with" another element, there are no intervening elements present.

Hereinafter, a substrate support device according to several embodiments of the present disclosure will be described.

Figure 2:
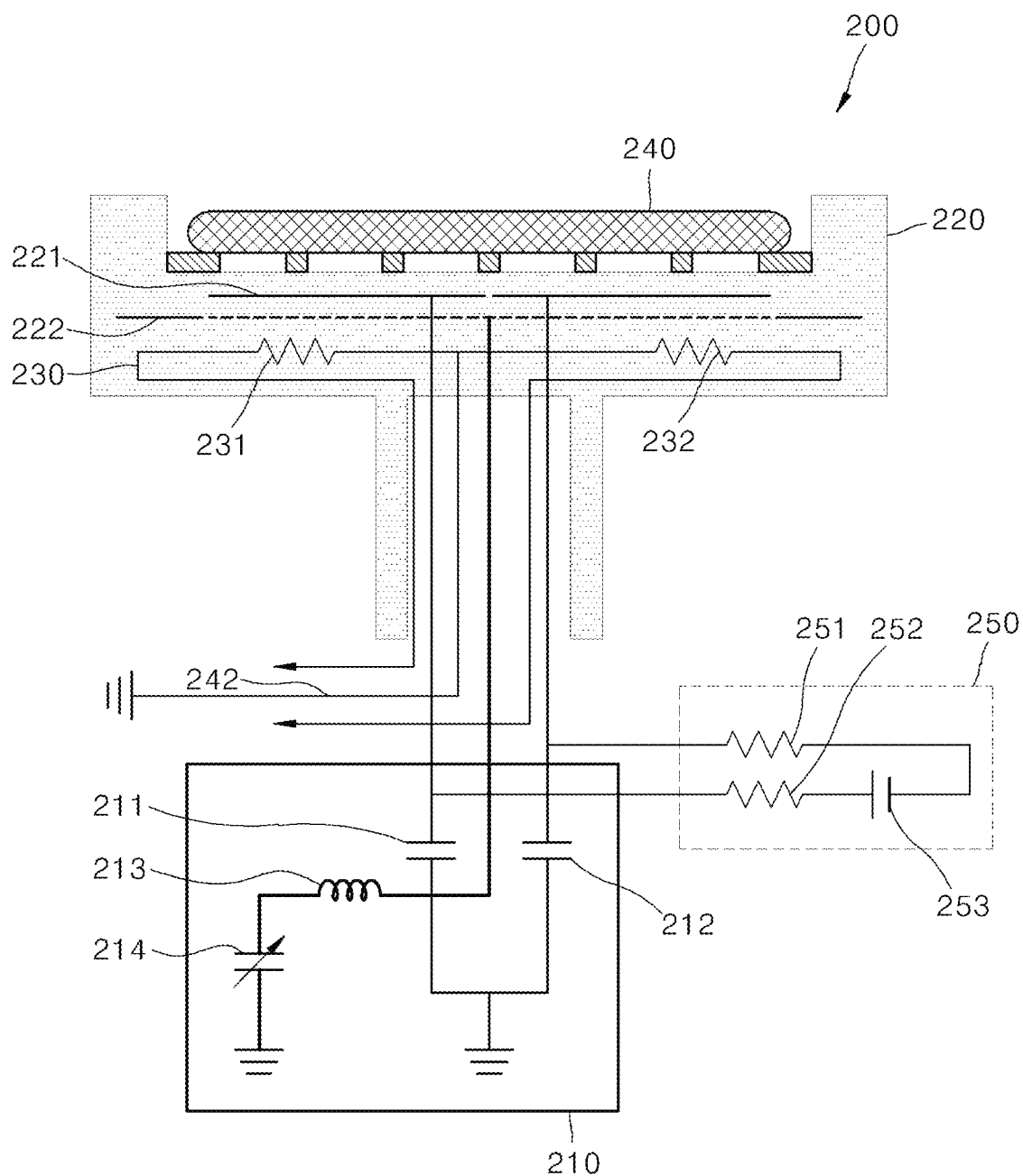
FIG. 2 is a schematic view showing a circuit structure of a substrate support device according to an embodiment of the present disclosure.

FIG. 2 is a schematic view showing a circuit structure of a substrate support device according to an embodiment of the present disclosure.

Referring to FIG. 2, a substrate support device 200 according to an embodiment of the present disclosure may include a substrate support part 220 on which a wafer 240 is disposed; a chucking circuit 250 configured to apply a DC voltage to a mesh electrode (e.g., a first mesh electrode 221) provided in the substrate support part 220; and an edge control circuit 210 configured to control RF (Radio Frequency) and control a timing of operations related to a first mesh electrode 221 and a second mesh electrode 222 provided in the substrate support part 220. For example, the first mesh electrode 221 and the second mesh electrode 222 may be embedded in the substrate support part 220.

The configuration of the substrate support device shown in FIG. 2 may be according to one embodiment. Components of the substrate support device 200 are not limited to the embodiment shown in FIG. 2. If necessary, some of the components may be added, changed or deleted.

According to an embodiment, the substrate support part 220 may be made of ceramic having non-conducive characteristics. A wafer 240 may be disposed on the substrate support part 220. The first mesh electrode 221 receiving a DC voltage from the chucking circuit 250 may be disposed on the substrate support part 220, and the second mesh electrode 222 may be disposed under the first mesh electrode 221. A heating unit 230 may be disposed under the second mesh electrode 222 to provide heat. The heating portion may include a plurality of heating elements corresponding to the number of divided first mesh electrodes. For example, the heating unit 230 may include heating electrodes 231 and 232. For example, the heating electrodes 231 and 232 may include resistances.

Such the heating electrodes 231 and 232 may receive power and serve to heat the substrate support part 220 to a process temperature. The heating electrodes 231 and 232 may be connected with a ground 232.

When performing a process for the wafer by using plasma, a pair of electrodes may be provided. One may be a shower head electrode (not shown) provided on a top of the wafer 240 and the other one may be a mesh electrode (e.g., a first mesh electrode 221 and a second mesh electrode 222). The showerhead electrode and the mesh electrodes may serve as counter electrodes to each other.

According to an embodiment, the first mesh electrode 221 may be divided into one or two sub-mesh electrodes. The divided two sub-mesh electrodes may be disposed at a predetermined interval. The first mesh electrode 221 may serve as both a chucking electrode and a plasma electrode for absorbing the substrate with electrostatic force. Accordingly, A DC power source 253 for supplying static charge and a ground electrode 212 for plasma may be both connected with the first mesh electrode 221. One first mesh electrode 221 may be mono-polar type electrostatic chuck (ESC) and two first mesh electrodes 221 may be a bi-polar type ESC.

According to an embodiment, at least one spoke may be disposed under the first mesh electrode 221. For example, the spoke may be disposed on the same plane with the second mesh electrode 222. The arrangement of the spokes may vary based on presence of division of the first mesh electrode 221 is divided or the arrangement structure. The spoke may be an RF current conduction path connecting the plurality of mesh electrodes with a RF rode installed in a central shaft of the substrate support part, and may include a mesh electrode like the second mesh electrode 222. Accordingly, the second mesh electrode 220 may be positioned below the first mesh electrode 221 and the spoke may be disposed below the first mesh electrode 221.

The arrangement of the spoke may vary based on the number of the divided second mesh electrode and the arrangement structure of the divided sub-mesh electrodes. The second mesh electrode 222 may be configured to compensate for poor process uniformity in the edge.

Such the arrangement of the spoke may not be limited in the present disclosure.

According to an embodiment, the second mesh electrode 222 may be ring-shaped and divided into two, three or four sub-mesh electrodes with a uniform size. For example, the second mesh electrode 222 may be divided into a plurality of second sub-mesh electrodes to prevent induced electromotive force generated due to the closed loop. The induced electromotive force may be calculated based on [Equation 1] below $$\varepsilon = \Delta\Phi_B/\Delta_t (\varepsilon: \text{Electromotive force}, \Phi_B: \text{Magnetic flux}) \quad [\text{Equation 1}]$$

The induced electromotive force is generated based on the time change of the magnetic flux passing through the closed-loop coil.

According to an embodiment, when the first mesh electrode 221 is divided into two first sub-mesh electrodes, the two divided first sub-mesh electrodes may overlap with each other on an inner circumferential surface of the second mesh electrode (in other words, a diameter of the first sub-mesh electrode is greater than an inner diameter of the second mesh electrode to overlap in some area).

According to an embodiment, when the first mesh electrode 221 may be divided into two first sub-mesh electrodes and the second mesh electrode 222 is divided into four second sub-meshes, a first spoke may be disposed under the two first sub-meshes in a direction equal to a direction in which the two first sub-mesh electrodes are spaced apart from each other. A second spoke may be disposed perpendicular to the first spoke. The first spoke and the second spoke may be disposed on the same plane with the second mesh electrode 222.

For example, the two first sub-mesh electrodes may overlap on inner circumferential surfaces of the four second-sub mesh electrodes in a direction, in which the spaced direction of the two first sub-mesh electrodes is not equal to the spaced direction of the four second sub-mesh electrodes, spaced a predetermined distance apart from each other.

According to an embodiment, when the first mesh electrodes 221 may be divided into two first sub-mesh electrodes and the second mesh electrode 222 is divided into two second sub-mesh electrodes, the spoke may be disposed below the two first sub-mesh electrodes in the same direction as the spaced direction of the two first sub-mesh electrodes. For example, the spoke may be disposed on the same plane with the two second sub-mesh electrodes.

Due to asymmetry in the structure of the chamber, the wafer might be distorted. In order to match this, the spokes 431 may be arranged in an oblique direction with respect to the spaced apart direction of the first sub-mesh electrodes.

According to an embodiment when the first mesh electrode 221 is divided into two first sub-mesh electrodes and the second mesh electrode 222 is divided into three second sub-mesh electrodes, the spokes may be disposed under the two first sub-mesh electrodes in a direction opposite to the spaced apart direction of the three second sub-mesh electrodes. For example, the spokes may be disposed on the same plane with the three second sub-mesh electrodes.

According to an embodiment, when one first mesh electrode 221 is provided and the second mesh electrode 222 is divided into four second sub-mesh electrodes, the first spoke and the second spoke may be disposed under the first mesh electrode 221. The first spoke may be disposed in a direction that bisects an angle formed by the spaced apart direction of the four second sub-mesh electrodes. The second spoke may be disposed in a direction perpendicular to the first spoke.

According to an embodiment, the chucking circuit 250 may include two resistances 251 and 252, and a DV power source 253.

According to an embodiment, a first resistance 251 may be connected to one of the at least two sub-mesh electrodes divided from the first mesh electrode 221. A second resistance 252 may be connected to the other of the at least two sub-mesh electrodes. Accordingly, the DC voltage transmitted from the DC power source 253 may be supplied to the first mesh electrode 221.

According to an embodiment, the DC voltage through the resistors 251 and 252 of the chucking circuit 250 may not be conducted by capacitors 211 and 212 of the edge control circuit 210 and may be transmitted to the substrate support part 220.

According to an embodiment, the edge control circuit 210 may include capacitors 211 and 212 electrically connected with the first mesh electrode, a coil 213 electrically connected with the second mesh electrode, and a variable capacitor 214 for controlling RF.

The edge control circuit 210 may perform operations related to the timing of operations related to the RF mesh electrode and low frequency/high frequency generation.

Figure 3:
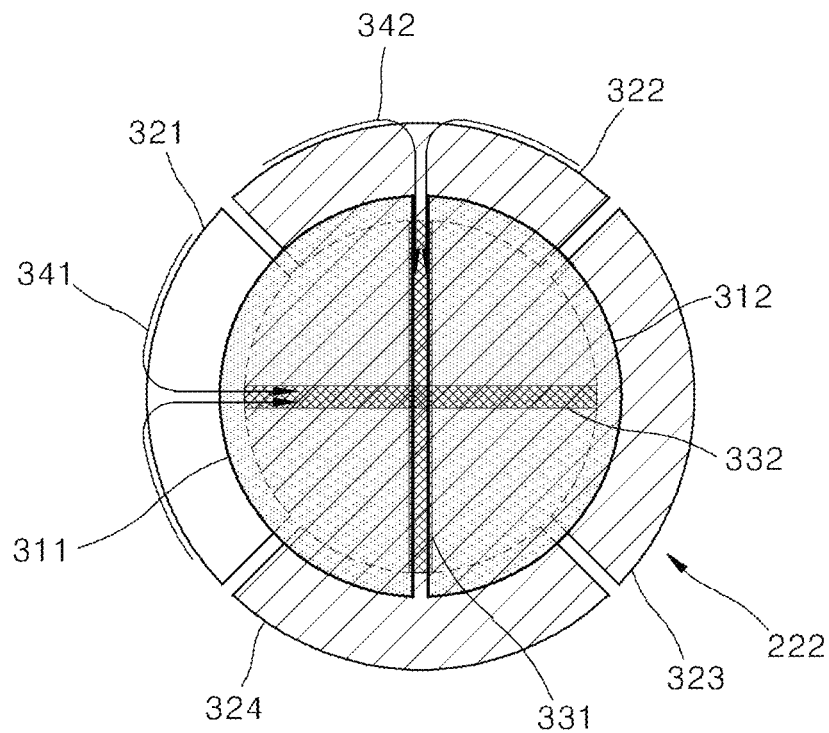
FIG. 3 is a view showing a structure of a mesh electrode according to a first embodiment of the present disclosure.

FIG. 3 is a view showing a structure of a mesh electrode according to a first embodiment of the present disclosure.

Referring to FIG. 3, the first mesh electrode 221 may be divided into two first sub-mesh electrodes 311 and 312. The two first sub-mesh electrodes 311 and 312 may be disposed on a top of the second mesh electrode 222, spaced apart a predetermined distance from each other. The second mesh electrode 222 may be divided into four second sub-mesh electrodes 321, 322, 323 and 324. The four second sub-mesh electrodes 321, 322, 323 and 324 may be disposed under the first mesh electrodes 221, spaced a predetermined distance apart from each other.

According to an embodiment, the first mesh electrodes 221 may be spaced a predetermined distance apart from each other by overlapping a circumference of the first mesh electrode 221 with an inner circumferential surface of the second mesh electrode 222 (in other words, the circumference of the first mesh electrode 221 is greater than the inner circumference diameter of the second mesh electrode 222 to overlap some area. For example, each of the two first sub-mesh electrodes 311 and 312 may be disposed to overlap with the inner circumferential surface of each of the four second sub-mesh electrodes 321, 322, 323 and 324.

A non-conductive material (e.g., ceramic) may be disposed to insulate between the first mesh electrode 221 and the second mesh electrode 222.

According to an embodiment, the first spoke 331 may be disposed under the first sub-mesh electrodes 311 and 312 in the same direction as the spaced apart direction of the first sub-mesh electrodes 311 and 312. The second spoke 332 may be disposed below the first sub-mesh electrodes in a direction perpendicular to the traveling direction of the first spoke 331.

As described above, in the structure of the mesh electrodes according to the first embodiment, the four second sub-mesh electrodes may be disposed and the two first mesh-electrodes 311 and 312 may be disposed above the four second sub-mesh electrodes 321, 322, 323 and 324. In addition, the two spokes 331 and 332 disposed perpendicular to each other may be disposed under the two first sub-mesh electrodes 311 and 312.

According to an embodiment, a heating unit 230 for supplying heat may be disposed under the second mesh electrode 222. The heating unit 230 may include a plurality of heating elements corresponding to the number of the divided first sub-mesh electrodes. For example, when the first mesh electrode 221 is divided into two first sub-mesh electrodes 311 and 312, the heating unit 230 may include two heating electrodes 231 and 232. Each of the heating electrodes may be disposed under each corresponding one of the first sub-mesh electrodes.

According to an embodiment, a non-conductive material (e.g., ceramic) may be disposed to insulate between the first mesh electrode 221 and the second mesh electrode 222. In addition, the non-conductive material (e.g., ceramic) may be disposed to insulate between the spokes 331 and 332 and the first sub-mesh electrodes 311 and 312. Even between the second sub-mesh electrodes 321, 322, 323 and 324 and the heating unit 230 may be also disposed the non-conductive material (e.g., ceramic).

According to the present disclosure, the closed-loop may be changed to an open-look by dividing the second mesh electrode 222 into four second sub-mesh electrodes. The current paths 341 and 342 of the second mesh electrodes 222 may be controlled by removing the induced electromotive force generated due to the closed-loop, thereby removing randomness.

Figure 4:
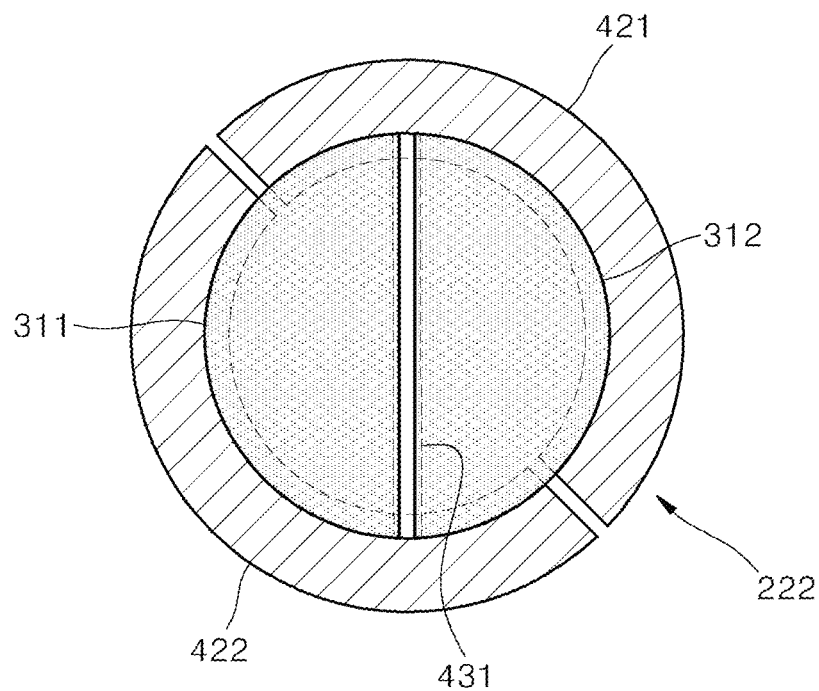
FIG. 4 is a view showing a structure of a mesh electrode according to a second embodiment of the present disclosure.

FIG. 4 is a view showing a structure of a mesh electrode according to a second embodiment of the present disclosure.

Referring to FIG. 4, the first mesh electrode 221 may be divided into two first sub-mesh electrodes 311 and 312. The two first sub-mesh electrodes 311 and 312 may be disposed above the second mesh electrode 222, spaced a predetermined distance apart from each other. The second mesh electrode 222 may be divided into two second sub-mesh electrodes 421 and 422. The two second sub-mesh electrodes 421 and 422 may be disposed under the first mesh electrode 221, spaced a predetermined distance apart from each other.

According to an embodiment, the first mesh electrode 221 may overlap with an inner circumferential surface of the second mesh electrode 222 (in other words, the circumference of the first mesh electrode 221 is greater than an inner diameter of the second mesh electrode 222 to overlap in some area). For example, each of the two first sub-mesh electrodes 311 and 312 may be disposed to overlap with the inner circumferential surface of each of the two second sub-mesh electrodes 421 and 422.

The spaced apart direction of the two first sub-mesh electrodes 311 and 312 may not be equal to that of the two second sub-mesh electrodes 421 and 422.

The first mesh electrode 221 and the second mesh electrode 222 may be insulated from each other by a non-conductive material (e.g., ceramic).

According to an embodiment, the spoke 431 may be disposed under the first sub-mesh electrodes 311 and 312 in a direction equal to the spaced apart direction of the first sub-mesh electrodes 311 and 312. In this instance, there may be an advantage of compensating for the problem of missing the RF path in the distance between the first sub-mesh electrodes.

Although not shown in the drawings, the spoke 431 may be disposed under the first sub-mesh electrodes 311 and 312 in a direction perpendicular to the spaced apart direction of the first sub-mesh electrodes 311 and 312. In this instance, a symmetrical structure may be provided to improve uniformity of the RF paths.

Meanwhile, the inner space of the chamber cannot be perfectly symmetrical based on the design. Although not shown in the drawings, the spokes 431 may be arranged at various angles to improve the uniformity of the RF paths according to the asymmetric structure of the chamber.

As described above, in a structure of the mesh electrode according to a second embodiment of the present disclosure, two second sub-mesh electrodes 421 and 422 may be disposed and two first sub-mesh electrodes 311 and 312 may be disposed above the two second sub-mesh electrodes 421 and 422. The spoke 431 may be disposed under the two first sub-mesh electrodes 311 and 312 in a direction different from the spaced apart direction of the two first sub-mesh electrodes 311 and 312.

According to an embodiment, a heating unit 230 for supplying heat may be disposed under the second mesh electrode 222. The heating unit 230 may include a plurality of heating elements corresponding to the number of the divided first sub-mesh electrodes 221. For example, when the first mesh electrode 221 is divided into two first sub-mesh electrodes 311 and 312, the heating unit 230 may include two heating electrodes 231 and 232. Each of the heating electrodes may be disposed under each corresponding one of the first sub-mesh electrodes.

According to an embodiment, the first mesh electrode 221 and the second mesh electrode 222 may be insulated from each other by a non-conductive material (e.g., ceramic). Between the spoke 431 and the first sub-mesh electrodes 311 and 312 and between the second sub-mesh electrodes 421 and 422 and the heating unit 230 may be also insulated.

According to the present disclosure, the closed-loop may be changed to an open-look by dividing the second mesh electrode 222 into four second sub-mesh electrodes. The current paths 341 and 342 of the second mesh electrodes 222 may be controlled by removing the induced electromotive force generated due to the closed-loop, thereby removing randomness.

Figure 5:
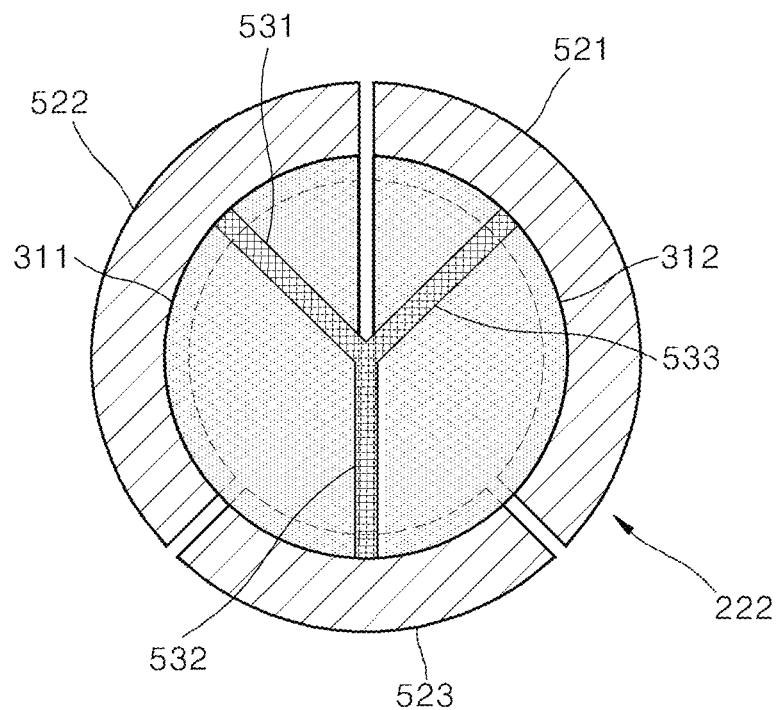
FIG. 5 is a view showing a structure of a mesh electrode according to a third embodiment of the present disclosure.

FIG. 5 is a view showing a structure of a mesh electrode according to a third embodiment of the present disclosure.

Referring to FIG. 9, the first mesh electrode 221 may be divided into two first sub-mesh electrodes 311 and 312. The two first sub-mesh electrodes 311 and 312 may be disposed above the second mesh electrode 222, spaced a predetermined distance apart from each other. The second mesh electrode 222 may be divided into three second sub-mesh electrodes 521, 522 and 523. The three second sub-mesh electrodes 521, 522 and 523 may be disposed under the first mesh electrode 221, spaced a predetermined distance apart from each other.

According to an embodiment, the first mesh electrodes 221 may overlap with an inner circumferential surface of the second mesh electrode 222 (in other words, a circumference of the first mesh electrode 221 is greater than an inner diameter of the second mesh electrode 222 to overlap some area), spaced a predetermined distance part from each other. For example, two first sub-mesh electrodes 311 and 312 may overlap with the inner circumferential surfaces of the three second sub-mesh electrodes 521, 522 and 523.

The spaced apart direction of the two first sub-mesh electrodes 311 and 312 may not be equal to that of the three second sub-mesh electrodes 521, 522 and 523 in at least predetermined area.

For example, the spaced apart shape of the three second sub-mesh electrodes 521, 522 and 523 may be different from the spaced apart shape of the two first sub-mesh electrodes 311 and 312.

According to an embodiment, the spokes 531, 532 and 533 may be disposed under the first sub-mesh electrodes 311 and 312 in a direction that is not equal to the spaced apart direction of the first sub-mesh electrodes 311 and 312.

For example, when the arrangement direction of the spokes 531, 532 and 533 is 'Y', the spaced apart direction of the three second sub-mesh electrodes 521, 522 and 523 may be a shape formed by rotating the 'Y' shape of the spokes 531, 532 and 533 by 180°.

As described above, in the structure of the mesh electrodes according to the third embodiment, the three second sub-mesh electrodes 521, 522 and 523 may be disposed and the two first sub-mesh electrodes 311 and 312 may be disposed above the three second sub-mesh electrodes 521, 522 and 523. In addition, the spokes 531, 532 and 533 may be disposed under the two first sub-mesh electrodes 311 and 312 in a direction opposite to the spaced apart direction of the two first sub-mesh electrodes 311 and 312. The spokes 531, 532 and 533 may be disposed on the same plane with the three second sub-mesh electrodes 521, 522 and 523.

According to an embodiment, the heating unit 230 for supplying heat may be disposed under the second mesh electrode 222. The heating unit 230 may include a plurality of heating elements corresponding to the number of the divided first mesh electrodes 221. For example, when the first mesh electrode 221 is divided into two first sub-mesh electrodes 311 and 312, the heating unit 230 may include two heating electrodes 231 and 232. Each of the heating electrodes may be disposed under each corresponding one of the first sub-mesh electrodes.

According to an embodiment, a non-conductive material (e.g., ceramic) may be disposed to insulate between the first mesh electrode 221 and the second mesh electrode 222, between the spokes 531, 532 and 533 and the first sub-mesh electrodes 311 and 312, and between the second sub-mesh electrodes 521, 522 and 523 and the heating unit 230.

According to the present disclosure, the closed-loop may be changed to an open-look by dividing the second mesh electrode 222 into the three second sub-mesh electrodes. The current paths of the second mesh electrodes 222 may be controlled by removing the induced electromotive force generated due to the closed-loop, thereby removing randomness. Accordingly, the present disclosure may be applicable in bipolar. In addition, the present disclosure may have higher uniformity as the number of the divided second mesh electrodes increases.

Figure 6:
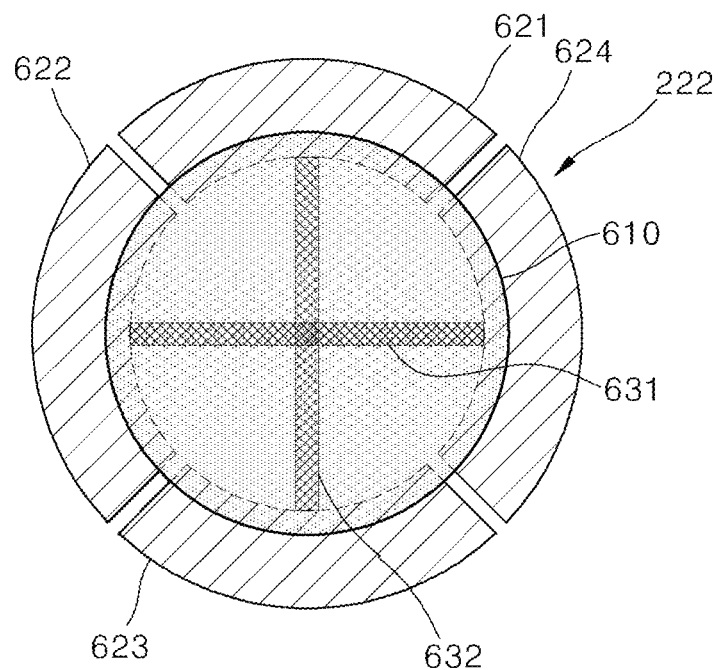
FIG. 6 is a view showing a structure of a mesh electrode according to a third embodiment of the present disclosure.

FIG. 6 is a view showing a structure of a mesh electrode according to a third embodiment of the present disclosure.

Referring to FIG. 6, one single first mesh electrode 610 may be provided and disposed above a second mesh electrode 222. The second mesh electrode 222 may be divided into four second sub mesh electrodes 621, 622, 623 and 624. The four second sub mesh electrodes 621, 622, 623 and 624 may be disposed under the first mesh electrode 610, spaced a predetermined distance apart from each other.

According to an embodiment, the first mesh electrode 610 may overlap on an inner circumferential surface of the second mesh electrode (in other words, a circumference of the first mesh electrode is greater than an inner circumferential diameter of the second mesh electrode 222 to overlap some area), spaced a predetermined distance apart. For example, the first mesh electrode 610 may be disposed to overlap with the inner circumferential surfaces of the four second sub-mesh electrodes 621, 622, 623 and 624.

According to an embodiment, spokes 631 and 632 may be disposed under the first mesh electrode 610 in a direction that is not equal to the spaced apart direction of the second sub-mesh electrodes 621, 622, 623 and 624. For example, the spokes 631 and 632 may be disposed on the same plane with the second sub-mesh electrodes 621, 622, 623 and 624.

For example, when the spaced apart shape formed by the four second sub-mesh electrodes 621, 622, 623 and 624 is 'x', the arrangement shape of the spokes 631 and 632 may be '+'.

As described above, in the structure of the mesh electrodes according to the fourth embodiment, the four second sub-mesh electrodes 621, 622, 623 and 624 may be disposed and the first mesh electrode 610 may be disposed above the fourth second sub-mesh electrodes 621, 622, 623 and 624.

According to an embodiment, the heating unit 230 for supplying heat may be disposed under the second mesh electrode 222. Such the heating unit 230 may include a heating element corresponding to the first mesh electrode 610. For example, when a single first mesh electrode 610 is provided, the heating unit 230 may include a single heating electrode.

According to an embodiment, between the first mesh electrode 610 and the second mesh electrode 222, between the spokes 631 and 632 and the first mesh electrode 610, and between the second sub-mesh electrodes 621, 622, 623 and 624 and the heating unit 230 may be insulated by a non-conductive material (e.g., ceramic) not to interfere with each other.

According to the present disclosure, the closed-loop may be changed to an open-look by dividing the second mesh electrode 222 into the four second sub-mesh electrodes. The current paths of the second mesh electrodes 222 may be controlled by removing the induced electromotive force generated due to the closed-loop, thereby removing randomness. Accordingly, the present disclosure may be applicable in monopolar as well as bipolar.

Each operation in each of the flow charts described above may be implemented regardless of the order shown or may be implemented simultaneously. In addition, at least one component of the present disclosure and at least one operation performed by the at least one component may be realized as hardware and/or software.

The embodiments are described above with reference to a number of illustrative embodiments thereof. However, the present disclosure is not intended to limit the embodiments and drawings set forth herein, and numerous other modifications and embodiments can be devised by one skilled in the art. Further, the effects and predictable effects based on the configurations in the disclosure are to be included within the range of the disclosure though not explicitly described in the description of the embodiments.

The invention claimed is:

1. A substrate support device comprising:
   a substrate support part on which a wafer is deposited, the substrate support part comprising a first mesh electrode and a second mesh electrode disposed under the first mesh electrode;
   a chucking circuit configured to apply a DC voltage to the first mesh electrode; and
   an edge control circuit configured to control timings of operations related to the first mesh electrode and the second mesh electrode and control RF (Radio Frequency),
   wherein the second mesh electrode is divided into a plurality of second sub-mesh electrode to remove an induced electromotive force generated due to a closed loop.

2. The substrate support device of claim 1, wherein the second mesh electrode has a ring shape.

3. The substrate support device of claim 1, further comprising:
   a spoke disposed under the first mesh electrode,
   wherein the spoke is disposed on the same plane with the second mesh electrode.

4. The substrate support device of claim 1, wherein the first mesh electrode is one or divided into two first sub-mesh electrodes.

5. The substrate support device of claim 4, wherein when the first mesh electrode is divided into the two first sub-mesh electrodes, the two first sub-mesh electrodes overlap on an inner circumferential surface of the second mesh electrode, spaced a predetermined distance apart from each other.

6. The substrate support device of claim 4, wherein when the first mesh electrode is divided into the two first sub-mesh electrodes and the second mesh electrode is divided into four second sub-mesh electrodes, the substrate support device comprises,
   a first spoke disposed under the two first sub-mesh electrodes in a direction equal to a spaced apart direction of the two first sub-mesh electrodes; and
   a second spoke disposed perpendicular to the first spoke.

7. The substrate support device of claim 6, wherein the two first sub-mesh electrodes overlap on inner circumferential surfaces of the four second sub-mesh electrodes, spaced a predetermined distance apart from each other in a direction in which the spaced apart direction of the two first sub-mesh electrodes is not equal to a spaced apart direction of the four second sub-mesh electrodes.

8. The substrate support device of claim 4, wherein when the first mesh electrode is divided into the two first sub-mesh electrodes and the second mesh electrode is divided into two second sub-mesh electrodes, the substrate support device comprises,
   a spoke disposed under the two first sub-mesh electrodes in a direction perpendicular to the spaced apart direction of the two first sub-mesh electrodes.

9. The substrate support device of claim 8, wherein the two first sub-mesh electrodes overlap on inner circumferential surfaces of the two second sub-mesh electrodes in a direction in which the spaced apart direction of the two first sub-mesh electrodes bisects an angle formed by the spaced apart direction of the two second sub-mesh electrodes and the direction of the spoke, spaced a predetermined distance apart from each other.

10. The substrate support device of claim 4, wherein when the first mesh electrode is divided into the two first sub-mesh electrodes and the second mesh electrode is divided into three second sub-mesh electrodes, the substrate support device comprises,
    a spoke disposed under the two first sub-mesh electrodes in a shape opposite to a spaced apart shape of the three second sub-mesh electrodes.

11. The substrate support device of claim 4, wherein when the first mesh electrode is one and the second mesh electrode is divided into four second sub-mesh electrode, the substrate support device comprises,
    a first spoke disposed in a direction that bisects an angle formed by a spaced apart direction of the four second sub-mesh electrodes; and
    a second spoke disposed in a direction perpendicular to the first spoke.

12. A substrate support device configured to implement a deposition process for a surface of a wafer, the substrate support device comprising:
    a first mesh electrode disposed under the wafer, the first mesh electrode that is one or divided into one or two; and
    a second mesh electrode disposed under the first mesh electrode,
    wherein the second mesh electrode is divided into two, three or four electrodes to remove an induced electromotive force generated due to a closed-loop with the first mesh electrode.

13. The substrate support device of claim 12, wherein when the first mesh electrode is divided into two first sub-mesh electrodes and the second mesh electrode is divided into four second sub-mesh electrodes, the substrate support device comprises,
    a first spoke disposed under the two first sub-mesh electrodes in a direction equal to the spaced apart direction of the two first sub-mesh electrodes; and
    a second spoke disposed perpendicular to the first spoke.

14. The substrate support device of claim 12, wherein when the first mesh electrode is divided into two first sub-mesh electrodes and the second mesh electrode is divided into two second sub-mesh electrodes, the substrate support device comprises,
    a spoke disposed under the two first sub-mesh electrodes in a direction equal to the spaced apart direction of the two first sub-mesh electrodes; and
    a second spoke disposed in a direction perpendicular to a spaced apart direction of the two second sub-mesh electrodes.

15. The substrate support device of claim 12, wherein when the first mesh electrode is divided into two first sub-mesh electrode and the second mesh electrode is divided into three second sub-mesh electrodes,
    the substrate support device comprises,
    a spoke disposed under the two first sub-mesh electrodes in a shape opposite to a spaced apart shape of the three second sub-mesh electrodes.

16. The substrate support device of claim 12, wherein when the first mesh electrode is one and the second mesh electrode is divided into four second sub-mesh electrodes, the substrate support device comprises,
    a spoke disposed under the first sub-mesh electrode in a direction that bisects an angle formed by a spaced apart direction of the four second sub-mesh electrodes; and a second spoke disposed under the first mesh electrode in a direction perpendicular to a spaced apart direction of the two second sub-mesh electrodes.

\* \* \* \* \*